(12) United States Patent
Lusterman

(10) Patent No.: US 6,606,064 B1
(45) Date of Patent: Aug. 12, 2003

(54) SYSTEMS AND METHODS FOR USING A CLOSED FIELD ANTENNA FOR AIR INTERFACE TESTING

(75) Inventor: David R. Lusterman, San Diego, CA (US)

(73) Assignee: Mitsubishi Electric Corporation, Amagasaki (JP)

(*) Notice: Subject to any disclaimer, the term of this patent is extended or adjusted under 35 U.S.C. 154(b) by 0 days.

(21) Appl. No.: 09/966,255

(22) Filed: Sep. 27, 2001

(51) Int. Cl.[7] .............................. H01Q 9/04; H01Q 1/38
(52) U.S. Cl. .............................. 343/703; 343/700 MS; 343/791
(58) Field of Search .................. 343/703, 790–792, 343/700 MS

(56) References Cited

U.S. PATENT DOCUMENTS

| | | | | |
|---|---|---|---|---|
| 4,220,955 A | * | 9/1980 | Frye | 343/703 |
| 5,557,287 A | * | 9/1996 | Pottala et al. | 343/703 |
| 5,619,213 A | * | 4/1997 | Hays | 343/703 |
| 5,621,420 A | * | 4/1997 | Benson | 343/791 |
| 5,691,731 A | | 11/1997 | van Erven | 343/742 |
| 5,986,610 A | | 11/1999 | Miron | 343/702 |
| 6,054,952 A | | 4/2000 | Shen et al. | 343/700 MS |
| 6,215,448 B1 | * | 4/2001 | DaSilva et al. | 343/703 |

OTHER PUBLICATIONS

"Microstrip Antennas, Types and Design Methods", pp. 7–2 to 7–29.
D. Jefferies, Waveguides and Cavity Resonators, pp. 1–4, "Microstrip", Oct. 31, 1996.

* cited by examiner

Primary Examiner—Michael C. Wilmer
(74) Attorney, Agent, or Firm—Oblon, Spivak, McClelland, Maier & Neustadt, P.C.

(57) ABSTRACT

A tester comprises a first antenna that includes a cylinder formed from a dielectric material, a ground plane covering at least a portion of the outer surface of the cylinder, and a conductor covering a portion of the inner surface of the cylinder and located at approximately the axial midpoint of the center. The tester also includes a test fixture for holding a device under test and interfacing it with the first antenna.

19 Claims, 4 Drawing Sheets

US 6,606,064 B1

SYSTEMS AND METHODS FOR USING A CLOSED FIELD ANTENNA FOR AIR INTERFACE TESTING

BACKGROUND OF THE INVENTION

1. Field of the Invention

The invention relates generally to air interface testing of wireless communication devices and more particularly to systems and methods for a closed field antenna used for such testing.

2. Background

A wireless communication device typically includes a Radio Frequency (RF) port, or RF connector, that can be used to test the RF performance of the device. When using the RF port to test the device, a "tester" is interfaced to the device via the RF port. RF signals are then sent to the device and are received from the device through the RF port. The RF port, therefore, typically bypasses the device's antenna, which is an important factor in the RF performance of the device. Therefore, to fully test the device's RF performance, the antenna must be taken into account. This is accomplished through testing known as "air interface testing." An air interface test is designed to test the RF performance of a wireless communication device by sending RF signals to, and receiving RF signals from, the devices antenna.

Unfortunately, simulating the air interface in a manufacturing or test facility is a challenging task. First, the device under test (DUT) must be isolated from external, interfering signals that can cause erroneous test results. This is especially important in the factory, where many devices are being tested simultaneously. Second, the DUT must also be isolated from reflections of its own signals, which can cause self-interference, or self-jamming. In a confined environment, RF signals transmitted by a DUT can reflect off of near by objects and interfere with the test, causing erroneous result much like interfering signals from other devices.

In order to combat interference from externally generated signals, the DUT is typically placed inside a metal isolation box. The box prevents the externally generated signals from interfering with the air interface testing of the DUT. Unfortunately, the box makes the second problem, i.e., self-jamming, worse, because the inside of the box reflects the signals transmitted by the DUT. Therefore, the inside of the box is usually covered with RF absorbing material. But the RF absorbing material is very expensive and it is very difficult to achieve adequate absorption.

Another problem with conventional systems is a lack of reliability and repeatability of test results. This is partly due to the varying isolation and absorbing properties of different test boxes. It is also partly due to the alignment of the DUT within the box, which as a result of conventional test box designs is critical to achieving accurate results. In practice, however, it is very difficult to achieve accurate alignment tolerances with most conventional test boxes. Therefore, alignment issues and interference from internal and external signals makes it difficult to achieve repeatable, reliable test data that can be correlated from one test fixture to the next.

Due to the forgoing, conventional test fixtures/boxes tend to be large, expensive units that fail to produce reliable, repeatable, and comparable test data. Thus, correlation of test results for all DUTs across all test fixtures in a particular factory, for example, is difficult if not impossible.

SUMMARY OF THE INVENTION

In one aspect of the invention a tester useful for combating the above problems comprises a first antenna that includes a cylinder formed from a dielectric material, a ground plane covering at least a portion of the outer surface of the cylinder, and a conductor covering a portion of the inner surface of the cylinder and located at approximately the axial midpoint of the center. The tester also includes a test fixture for holding a device under test and interfacing it with the first antenna.

In one embodiment, the test fixture is configured to hold the device under test, which comprises a second antenna, and position the device under test such that the second antenna is substantially within the cylinder.

Other aspects, advantages, and novel features of the invention will become apparent from the following Detailed Description of Preferred Embodiments, when considered in conjunction with the accompanying drawings.

BRIEF DESCRIPTION OF THE DRAWINGS

Preferred embodiments of the present inventions taught herein are illustrated by way of example, and not by way of limitation, in the figures of the accompanying drawings, in which.

DETAILED DESCRIPTION OF THE PREFERRED EMBODIMENTS

Although the following discussion relates general to testing and test fixtures for wireless handsets, it will be apparent that the systems and methods described herein can be used to test over the air performance for any wireless transmitter. Implementations for different types of transmitters can require adjustments in the geometry and alignments of various components; however, these types of adjustments do not effect the basic operation or functionality of the systems and methods described herein.

The invention addressees the problems mentioned above using a closed field antenna to interface an air interface tester with the antenna of a DUT. Preferably, the closed field antenna comprises a cylinder, the outside of which is preferably plated or covered with a conductive material that acts as a ground plane. This ground plane reduces the need for absorbing material within a test box, for example, because the RF signals from the DUT are largely confined within the cylinder by the ground plane. Additionally, the ground plane also shields the DUT from external interference as well, thus eliminating the need for a test box entirely. As a result, a small, inexpensive test fixture can be designed using such a closed field antenna. Moreover, for reasons that will be explained more fully below, such a test fixture can provide repeatable, reliable test data that can be correlated from one test fixture to the next.

Figure 1:
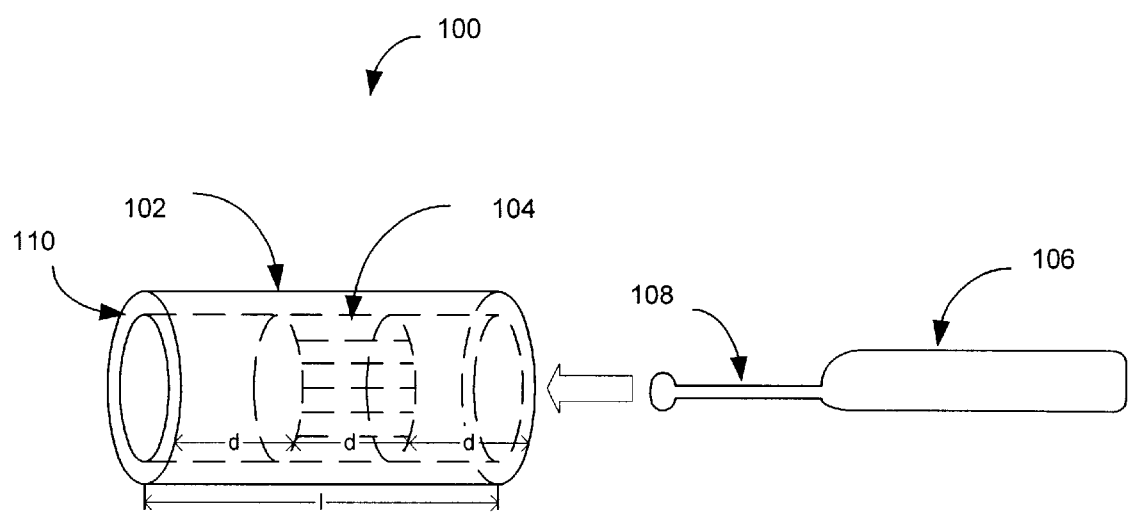
FIG. 1 is a diagram illustrating an example embodiment of a closed field antenna in relation to a device under test in accordance with the invention.

FIG. 1 is a diagram illustrating an example implementation of a closed field antenna 100 in accordance with the systems and methods described herein. As can be seen, closed field antenna 100 comprises a cylinder 110. On the inside of cylinder 110, there is a conductor 104, which is configured to transmit RF signals to and receive RF signals from DUT antenna 108. The outside of cylinder 1 10 is covered with a ground plane 102. It is ground plane 102 that confines the signals transmitted and received by conductor 104 within cylinder 110.

Antenna 100 is preferably configured so that conductor 104 is positioned approximately at the midpoint of DUT antenna 108, when DUT 106 is positioned for testing. The width (d) of conductor 104 is a function of the wavelength ($\lambda$) of the signals transmitted and received by conductor 104. For example, for an 800 MHz application, d can be chosen to be a length approximately equal to ¼$\lambda$ at 800 MHz. Further, the length (l) of cylinder 110 is preferably an odd multiple of the width (d) of conductor 104. In the embodiment illustrated in FIG. 1, for example, the length (l) of cylinder 110 is equal to three times the width of conductor 104, i.e., l=3×d. Thus, there is a distance d from conductor 104 to either end of cylinder 110. DUT antenna 108, however, radiates along its whole length. Therefore, it may be necessary to extend the length (l) of cylinder 110 to the length of antenna 108 so that ground plane 102 will adequately contain the radiating energy and provide adequate shielding from external interference. If the length (l) of cylinder 110 is extended, then the length of cylinder 110 is preferably still an odd multiple of d, such as 5d, 7d, etc.

Cylinder 110 is constructed from a dielectric material. Thus, the dielectric separates ground plane 102 from conductor 104. The thickness (t) of the dielectric material should be sufficient to result in a very low capacitance between ground plane 102 and conductor 104. The low capacitance enables broadband operation such that multiple ranges can be tested, such as both ranges in a dual mode application. For example, a conductor with a length (l) equal to ¼$\lambda$ at 800 Mhz is also approximately equal to ⅝$\lambda$ at 1.9 GHz. Such a conductor 104 can be used for a dual mode 800 MHz1.9 GHz application if a thickness (t) is selected for the dielectric material that allows conductor 104 to operate over the range from 800 MHz to 1.9 GHz.

Figure 2A:
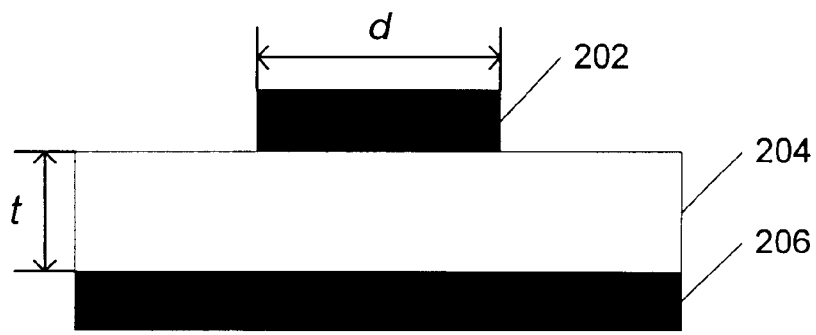
FIG. 2A is a side view of a cross section of an example closed field antenna such as the antenna in FIG. 1.

FIG. 2A illustrates a side view of a cross section of a closed field antenna 200 and is useful to illustrate the impact of the thickness (t) of the dielectric material. As can be seen, conductor 202 of length (d) is separated from ground plane 206 by cylinder 204, which is made of a dielectric material. The view shown in FIG. 2A makes it easy to see that conductor 202, cylinder 204, and ground plane 206 form a capacitor, wherein conductor 102 and ground plane 206 act as the capacitor plates. The capacitance of a capacitor is affected by the area of the plates that form the capacitor, the distance between the plates, and the ability of the dielectric to support electrostatic forces. Larger plates provide greater capacity to store electric charge. Therefore, as the area of the plates increases, capacitance also increases. This means that the length (l) and width (d) of ground plane 206 and conductor 202, respectively, will have a direct impact on the capacitance between the two. Thus, the effect of these dimensions on the capacitance must be taken into account for each application and can vary depending on the implementation.

Capacitance is also directly proportional to the electrostatic force field between the plates. This field is stronger when the plates are closer together. Therefore, as the distance between the plates decreases, i.e., (t) is decreased, capacitance increases. Therefore, to obtain the required capacitance, the thickness (t) will also need to vary depending on the implementation as well as variables such as the length (l) of ground plane 206 and/or the width (d) of conductor 202. Because the selection of these other parameters, e.g., the length (l) and width (d), can be effected by other implementation concerns, the thickness (t) of the dielectric is preferably used to control the capacitance formed between conductor 202 and ground plane 206. For example, the width (d) of conductor 202 is dependent on the wavelength of the signals that it will transmit and receive, as explained above. Further, the length (l) of ground plane 206 is dependent on the length of the cylinder and/or the length of the DUT's antenna. Therefore, once (l) and (d) are selected as required by these other concerns, the thickness (t) of cylinder 204 can be selected to provide the requisite capacitance.

It should also be noted that the dielectric material used for cylinder 204 will impact the capacitance formed between conductor 202 and ground plane 206. Dielectric materials are rated based upon their ability to support electrostatic forces in terms of a number called a dielectric constant. The higher the dielectric constant the greater the ability of the dielectric to support electrostatic forces, which means that as the dielectric constant increases, capacitance increases. But the selection of the material used to construct cylinder 204 can also be constrained by other parameters, such as price or availability of the material. As a result, the type of dielectric material may need to be selected for reasons unrelated to the capacitance required between conductor 202 and ground plane 206.

Therefore, the thickness (t) is preferably the primary manner to control the capacitance between conductor 202 and ground plane 206, but clearly there are numerous design choices that will impact the capacitance. The designer should keep such impact in mind when making such choices for each application.

Figure 2B:
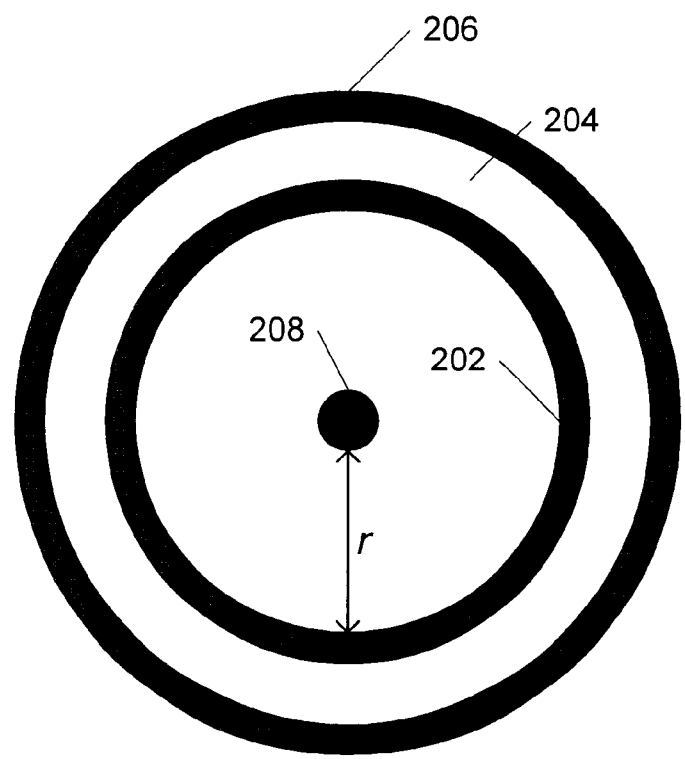
FIG. 2B is a cross sectional view of the example closed field antenna of FIG. 2A.

FIG. 2B illustrates a cross sectional view of cylinder 200, with a DUT antenna 208 positioned within cylinder 200 for testing. Thus, test signals will travel between conductor 202 and DUT antenna 208 in order to test the over the air performance of the DUT. Because DUT antenna 208 is shielded both from external interference and from interference generates by its own transmissions, the tolerance on the position (r) of DUT antenna 208 is relatively loose. Therefore, DUT antenna 208 just needs to be approximately in the center of cylinder 200. The tolerance on the position of conductor 202 relative to DUT antenna 208 is also relatively loose. Thus, DUT antenna 208 needs to only be positioned within cylinder 200 such that conductor 202 will be at approximately the midpoint of DUT antenna 208.

Because of the wide tolerances, and immunity to interference that inheres from the use of closed field antenna 200, the reliability and repeatability of the test results achieved are greatly increased. Moreover, a high degree of correlation between fixtures is achievable. Thus, the use of a closed field antenna 200 allows for the construction of an inexpensive fixture that not only improves reliability and repeatability, but also provides a high degree of correlation between fixtures.

The cost of a test fixture that incorporates a closed field antenna, such as antenna 200, can be reduced even further by an appropriate selection of material for use in constructing the closed field antenna. The attributes and functionality of such a closed field antenna allow for the use of common, inexpensive material in its design. For example, a PVC pipe and copper tape can be used for the cylinder and ground plane, respectively. The conductor can also be formed as a microstrip antenna using copper tape or equivalent. A microstrip transmission line is a type of printed circuit construction, consisting of a track of copper or equivalent conductor on an insulating substrate. Additionally, there is a backplane on the other side of the insulating substrate, which is formed from a similar material as the conductor.

Referring again to the view of cylinder 200 illustrated in FIG. 2B, it is easy to see that conductor 202, cylinder 204, and ground plane 206 form a microstrip transmission line. Thus, conductor 204 is preferably formed from copper tape or the equivalent, which is common and widely available it is also common to use plastic for the insulating substrate in microstrip transmission line construction, so as mentioned above simple PVC will suffice for the cylinder. The result is an extremely efficient and low cost test fixture in which alignment tolerances are much less critical than conventional fixtures. Testing will of course produce some more precise alignment tolerances, but the results from test fixture to test fixture should be highly correlative.

Figure 3:
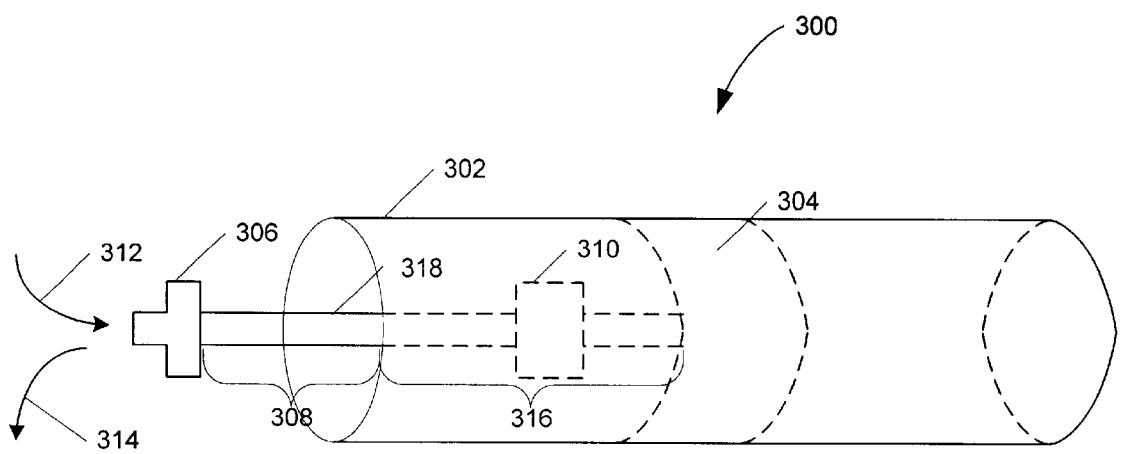
FIG. 3 is a diagram illustrating an example embodiment of a closed field antenna with an example interface to a test system in accordance with the invention.

To complete the construction of a closed field antenna in accordance with the systems and method for using a closed field antenna for air interface testing, a means for interfacing the closed field antenna with the test equipment is required. Example closed field antenna 300 in FIG. 3 illustrates one embodiment of such an interface. The interface comprises a RF connector 306 that can be connected to the test equipment. RF connector 306 is configured to pass RF signals 312 received from the DUT to the test equipment, where they can be evaluated, and to receive RF signals from the test equipment, which are then transmitted to the DUT via conductor 304.

The interface from RF connector 306 to conductor 304 preferably consists of some form of RF transmission line 318. Thus, for example the portion 316 of transmission line 318 that is inside cylinder 302 can preferably comprise a microstrip transmission line. In one embodiment, RF connector 306 is then coupled to RF transmission line 318 right at the edge of cylinder 302. Alternatively, RF transmission line 318 can also comprise a portion 308 that extends beyond cylinder 302, which preferably consists of a cabled RF transmission line complete with shielding to prevent both external interference and interference from the signals 312 and 314 generated during testing.

The RF impedance of RF transmission line 318 must match that of conductor 304 otherwise RF energy arriving at the interface between RF transmission line 318 and conductor 304 will be reflected back in the direction from which it came. Thus, an impedance matching network 310 is preferably included that is configured to match the impedance of transmission line 318 with that of conductor 304. In this manner reflections are reduced and the efficiency of conductor 304 is increased.

Figure 4:
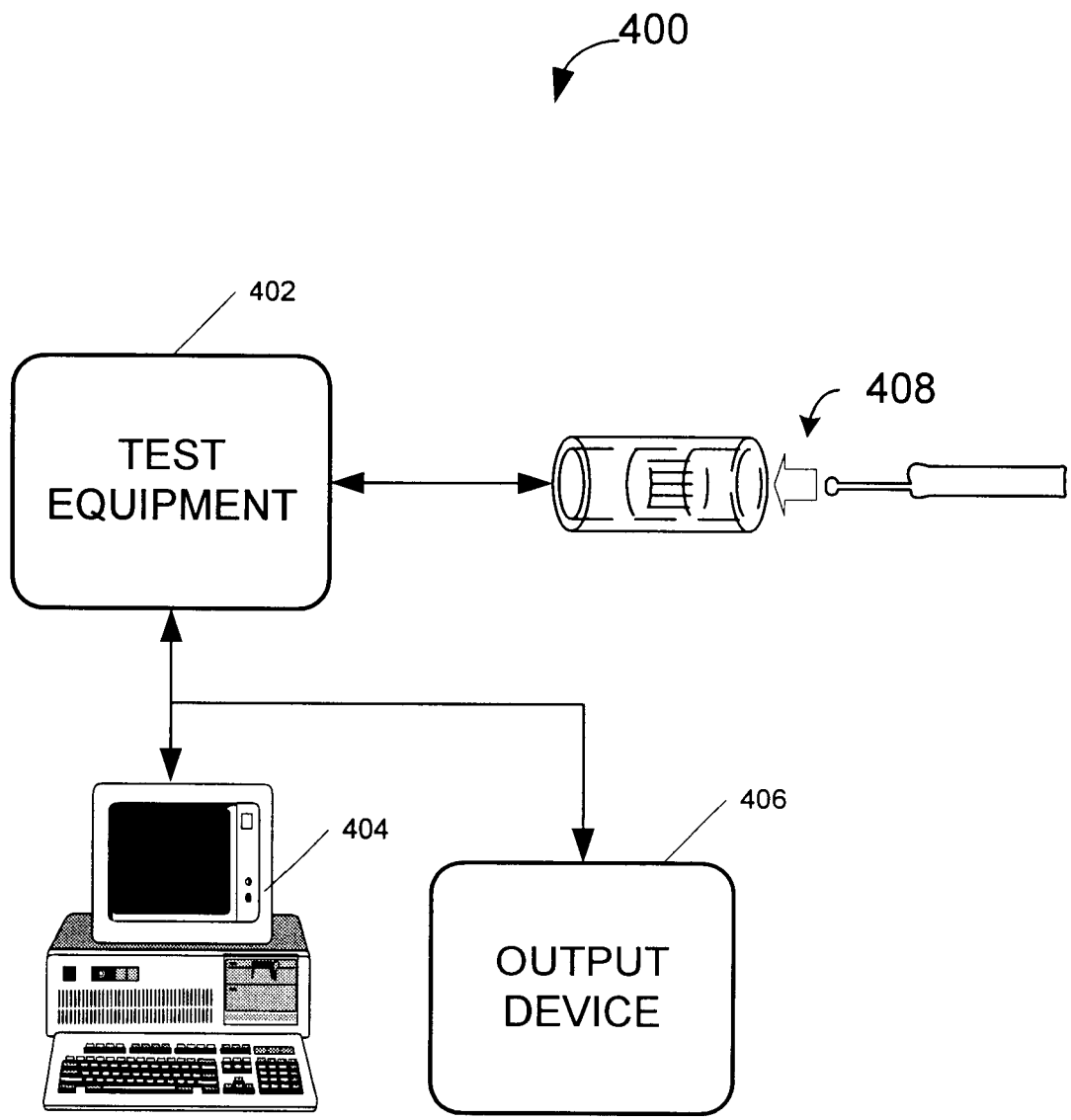
FIG. 4 is a logical block diagram of an example test system that includes a closed field antenna such as the antenna in FIG. 1.

FIG. 4 illustrates a logical block diagram of an example air interface tester 400 that utilizes a closed field antenna in accordance with the systems and methods described herein. Air interface tester 400 comprises computer 404 and test equipment 402. Test equipment 402 can, for example, comprise a RF signal generator and an RF signal receiver. Computer 404 runs a software program that controls the testing. Test equipment 402 is interfaced with a closed field antenna 408, and a DUT 410 positioned so that its antenna is inserted within closed field antenna 408. Computer 404 then controls, based on the software program, the generation of signals to be transmitted to DUT 410 and the evaluation of signals received from DUT 408. Preferably tester 400 also includes an output device 406, which can, for example, be a printer to print out the test results and/or a display to display the test results both during and after testing.

Another advantage of the immunity to interference and wide tolerance of a closed field antenna designed in accordance with the systems and methods described herein, is that setup and calibration for an air interface tester, such as tester 400, is quick an reliable. This not saves time and money and allows for easy and quick reconfiguration for different DUTs. Thus, use of a closed field antenna 408 in an air interface tester, such as tester 400, provides repeatable, reliable test data that is highly correlative with other similar fixtures and that can be reconfigured quickly and reliably. Moreover, such a tester can be designed using inexpensive common material, which provides a tremendous cost savings.

While embodiments and implementations of the invention have been shown and described, it should be apparent that many more embodiments and implementations are within the scope of the invention. Accordingly, the invention is not to be restricted, except in light of the claims and their equivalents.

What is claimed is:

1. An antenna, comprising:
   a cylinder formed from a dielectric material;
   a ground plane covering at least a portion of the outer surface of the cylinder; and
   a conductor covering a portion of the inner surface of the cylinder and located at approximately the axial midpoint of the center,
   the width of the ground plane being an odd multiple of the width of the conductor.

2. The antenna of claim 1, wherein the width of the ground plane is at least as long as the length of a second conductor placed inside the cylinder for testing purposes.

3. The antenna of claim 1, wherein the conductor is configured to resonate at a desired frequency by selecting the width of the conductor to be a function of a wavelength that corresponds to the desired frequency.

4. The antenna of claim 3, wherein the width of the conductor is selected so that the antenna will resonate at a first and a second desired frequency.

5. The antenna of claim 1, wherein the thickness of the cylinder is selected so that a sufficiently low capacitance is formed between the conductor and the ground plane to allow for broadband operation of the antenna.

6. The antenna of claim 1, wherein the ground plane covers substantially all of the outer surface of the cylinder.

7. The antenna of claim 1, wherein the cylinder is made out of PVC.

8. The antenna of claim 1, wherein the cylinder, ground plane, and conductor are configured so as to form a microstrip antenna.

9. A tester, comprising:
   a first antenna, the antenna including:
      a cylinder formed from a dielectric material;
      a ground plane covering at least a portion of the outer surface of the cylinder; and
      a conductor covering a portion of the inner surface of the cylinder and located at approximately the axial midpoint of the center, and
   a test fixture configured to:
      hold a device under test, the device under test comprising a second antenna, and
      position the device under test such that the second antenna is substantially within the cylinder.

10. The tester of claim 9, wherein the fixture holds the device under test in a position such that the second antenna is approximately centered within the cylinder.

11. The tester of claim 9, wherein the tester is configured to test the air interface capabilities of the device under test.

12. The tester of claim 9, wherein the width of the ground plane is an odd multiple of the width of the conductor.

13. The tester of claim 9, wherein the test fixture is further configured to position the device under test within the cylinder such that the conductor is at approximately the midpoint of the second antenna.

14. The tester of claim 9, wherein the width of the ground plane is at least as long as the length of the second antenna.

15. The tester of claim 9, wherein the conductor is configured to resonate at a desired frequency by selecting the width of the conductor to be a function of a wavelength that corresponds to the desired frequency.

16. The tester of claim 9, wherein the width of the conductor is selected so that the antenna will resonate at a first and a second desired frequency.

17. The tester of claim 9, wherein the ground plane covers substantially all of the outer surface of the cylinder.

18. The tester of claim 9, wherein the cylinder, ground plane, and conductor are configured so as to form a microstrip antenna.

19. A method of constructing a closed field antenna comprising a conductor, a cylinder, and a ground plane, the method comprising:

selecting a width for the conductor based on a frequency at which the conductor is required to resonate;

selecting a length of the ground plane based on the length of a device under test antenna;

selecting a length of the cylinder to be at least as long as the length of the ground plane;

selecting the thickness of the cylinder based on a required capacitance between the conductor and the ground plane.

* * * * *